United States Patent
Kotani et al.

(10) Patent No.: US 8,143,618 B2
(45) Date of Patent: Mar. 27, 2012

(54) ZNO BASED SEMICONDUCTOR DEVICE AND ITS MANUFACTURE METHOD

(75) Inventors: Hiroshi Kotani, Yokohama (JP); Michihiro Sano, Odawara (JP); Hiroyuki Kato, Yokohama (JP); Naochika Horio, Yokohama (JP); Akio Ogawa, Yamato (JP); Tomofumi Yamamuro, Kawasaki (JP)

(73) Assignee: Stanley Electric Co., Ltd., Tokyo (JP)

( * ) Notice: Subject to any disclaimer, the term of this patent is extended or adjusted under 35 U.S.C. 154(b) by 144 days.

(21) Appl. No.: 12/371,965

(22) Filed: Feb. 17, 2009

(65) Prior Publication Data

US 2009/0206333 A1    Aug. 20, 2009

(30) Foreign Application Priority Data

Feb. 20, 2008 (JP) ................... 2008-038669

(51) Int. Cl.
*H01L 29/10* (2006.01)
*H01L 21/00* (2006.01)
(52) U.S. Cl. ............ 257/43; 257/102; 257/103; 438/22; 438/85
(58) Field of Classification Search ............ 257/43, 257/103, 102, E21.085, E29.296; 438/22, 438/85, 86, 104
See application file for complete search history.

(56) References Cited

U.S. PATENT DOCUMENTS

2005/0082543 A1 *  4/2005  Alizadeh et al. ............. 257/79
2009/0267062 A1 * 10/2009  Nakahara et al. ............ 257/43

FOREIGN PATENT DOCUMENTS

| JP | 3453857 B2 | 7/2003 |
| JP | 2004-247654 A | 9/2004 |
| JP | 2004-266057 A | 9/2004 |

* cited by examiner

*Primary Examiner* — Hung Vu
(74) *Attorney, Agent, or Firm* — Holtz, Holtz, Goodman & Chick, PC

(57) ABSTRACT

A ZnO based semiconductor device includes: a lamination structure including a first semiconductor layer containing ZnO based semiconductor of a first conductivity type and a second semiconductor layer containing ZnO based semiconductor of a second conductivity type opposite to the first conductivity type, formed above the first semiconductor layer and forming a pn junction together with the first semiconductor layer; and a Zn—Si—O layer containing compound of Zn, Si and O and covering a surface exposing the pn junction of the lamination structure.

10 Claims, 11 Drawing Sheets

Voltage-Current Characteristics of the First Comparative Example (before exposure)

Voltage-Current Characteristics of the First Comparative Example (after exposure)

US 8,143,618 B2

ZNO BASED SEMICONDUCTOR DEVICE AND ITS MANUFACTURE METHOD

CROSS REFERENCE TO RELATED APPLICATION

This application is based on and claims priority of Japanese Patent Application No. 2008-038669, filed on Feb. 20, 2008, the entire contents of which are incorporated herein by reference.

BACKGROUND OF THE INVENTION

A) Field of the Invention

The present invention relates to a ZnO based semiconductor device and its manufacture method.

B) Description of the Related Art

Zinc oxide (ZnO) is semiconductor of a direct transition type having a band gap energy of 3.37 eve at a room temperature, and has characteristics that a binding energy of exciton is 60 meV which is higher than that of other semiconductors, source materials are inexpensive, and there is less adverse effects upon environments and human bodies. It is therefore expected to realize a semiconductor light emitting device made of ZnO and having a high efficiency and a low consumption power.

It is, however, known that the electric characteristics, optical emission characteristics and the like of a ZnO based semiconductor light emitting device are degraded considerably by moisture adsorption to the device surface. It is very important industrial technologies to prevent moisture adsorption to a device surface, maintain stable device characteristics and prolong a device lifetime.

JP-A-2004-247654 discloses a technique of covering the surface of a ZnO based semiconductor light emitting device with a multilayer protective film made of two or more stacked different insulating organic compound films (e.g., polycarbonate and polyimide), in order to mitigate a problem that reactive current flows on the device surface via conductive material reduced by moisture adsorption and a problem of an increase in defects to be caused by device temperature rise due to optical emission and high density optical energy exposure. It also discloses a technique of improving tight adhesion by inserting an inorganic protective film (e.g., an $SiO_2$ film) between such a multilayer protective film and device.

In order to mitigate similar problems to those described in JP-A-2004-247654, JP-A-2004-266057 discloses a technique of using metal oxide or nitride as a protective film providing the protective effects relative to a reducing atmosphere. It is also describes that it is efficient that an insulating organic film is disposed on the surface of an uppermost layer.

A variety of techniques capable of improving moisture-proof of a ZnO based semiconductor device have been desired.

SUMMARY OF THE INVENTION

It is an object of the present invention to provide a novel ZnO semiconductor device with improved moisture-proof and its manufacture method.

According to one aspect of the present invention, there is provided a ZnO based semiconductor device including: a lamination structure including a first semiconductor layer containing ZnO based semiconductor of a first conductivity type and a second semiconductor layer containing ZnO based semiconductor of a second conductivity type opposite to the first conductivity type, formed above the first semiconductor layer and forming a pn junction together with the first semiconductor layer; and a Zn—Si—O layer containing compound of Zn, Si and O and covering a surface exposing the pn junction of the lamination structure.

According to another aspect of the present invention, there is provided a manufacture method for a ZnO based semiconductor device comprising steps of: (a) preparing a ZnO based semiconductor wafer including a first semiconductor layer containing ZnO based semiconductor of a first conductivity type and a second semiconductor layer containing ZnO based semiconductor of a second conductivity type opposite to the first conductivity type, formed above the first semiconductor layer and forming a pn junction together with the first semiconductor layer; (b) forming a groove in the ZnO based semiconductor wafer, the groove having a depth allowing to extend through the pn junction; and (c) forming a Zn—Si—O layer containing compound of Zn, Si and O and covering the pn junction exposed on an inner surface of the groove.

Waterproof of the Zn—Si—O layer can improve moisture-proof of a ZnO based semiconductor device.

DESCRIPTION OF THE PREFERRED EMBODIMENTS

Figure 1:
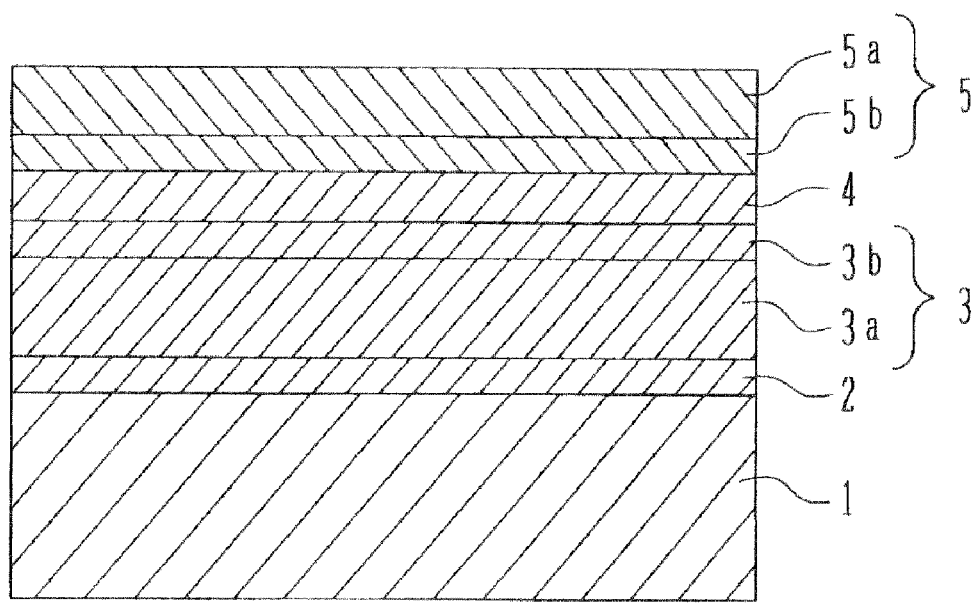
FIG. 1 is a schematic cross sectional view illustrating an example of a ZnO based semiconductor wafer.

First, with reference to FIG. 1, description will be made on a ZnO based semiconductor wafer (hereinafter called simply a wafer in some cases) used for manufacturing ZnO based semiconductor light emitting devices.

A ZnO single crystal substrate was prepared as a substrate 1 of an n-type conductivity type having a thickness of 400 μm. A ZnO based semiconductor wafer was formed by laminating on the substrate 1 a buffer layer 2 of a ZnO layer having a thickness of 10 nm, an n-type contact layer 3a of a ZnO layer having a thickness of 300 nm, an n-type clad layer 3b of an MgZnO layer having a thickness of 50 nm, an emission layer 4 having a multiple quantum well (MQW) structure constituted of three pairs of MgZnO/ZnO not doped with impurities and deposited at thicknesses of 2.5 nm/7 nm, a p-type clad layer 5b of an MgZnO layer doped with p-type impurities and having a thickness of 100 nm, and a p-type contact layer 5a of a ZnO layer doped with p-type impurities and having a thickness of 10 nm, in this order from the substrate 1 side.

Each of the n-type contact layer 3a, n-type clad layer 3b, emission layer 4, p-type clad layer 5b, and p-type contact layer 5a is subjected to crystal growth at a high temperature of 600° C. to 850° C., and the buffer layer 2 is subjected to crystal growth at a lower temperature (e.g., 300° C.). The buffer layer 2, n-type contact layer 3a and n-type clad layer 3b have an n-type conductivity type even if n-type impurities such as Ga are not doped. N is used as the p-type impurities.

The n-type contact layer 3a and n-type clad layer 3b are collectively called an n-type ZnO based semiconductor layer 3, and the p-type clad layer 5b and p-type contact layer 5a are collectively called a p-type ZnO based semiconductor layer 5. ZnO based semiconductor contains at least both Zn and O. The clad layer is provided to prevent leak of carriers from the emission layer. The structure omitting the clad layers may be used.

There are various lamination structures of a semiconductor wafer applicable to a semiconductor device such as a light emitting device. Functional layers required at the minimum are two layers: a p-type layer and an n-type layer constituting a pn junction. However, if the wafer is to be used for light emitting devices, it is general to adopt the structure that an emission layer is inserted between the p-type layer and n-type layer. Adopted as a typical example in this case is a structure that the p-type layer and n-type layer constitute a junction with the emission layer being interposed therebetween. The MQW structure is used as an example of the emission layer. In the following, the lamination structure constituted of the n-type ZnO based semiconductor layer 3, emission layer 4 and p-type ZnO based semiconductor layer 5 are called an operation layer in some cases.

The ZnO based semiconductor wafer prepared in this example was manufactured by using a radical source molecular beam epitaxy (RS-MBE) capable of supplying oxygen radicals from a radio frequency (RF) plasma gun. The ZnO based semiconductor wafer may be manufactured by other methods such as methods using metal organic vapor phase epitaxy (MOVPE), organic metal molecular beam epitaxy (MO-MBE), vapor phase epitaxy (VPE), pulse laser deposition (PLD), and the like.

The substrate 1 is not limited to the ZnO substrate. For example, a GaN substrate, an SiC substrate, an Si substrate and the like may be used if these substrates can grow each layer necessary for a ZnO based semiconductor light emitting device and are single crystal substrates having a conductivity. Even a non-conductive sapphire substrate, a GaN template substrate disposing a GaN layer on a sapphire substrate, or the like may also be used by adopting the device structure having electrodes directly connecting the operation layer.

Figure 2A:
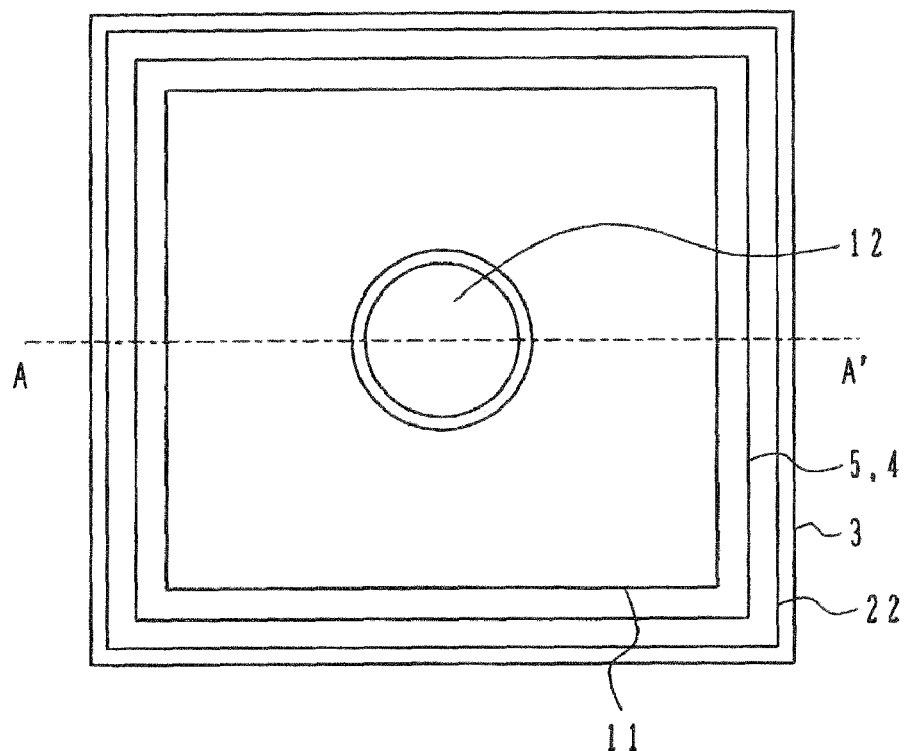
FIGS. 2A and 2B are a schematic plan view and a schematic cross sectional view, respectively, of a light emitting device according to a first embodiment of the present invention.
Figure 2B:
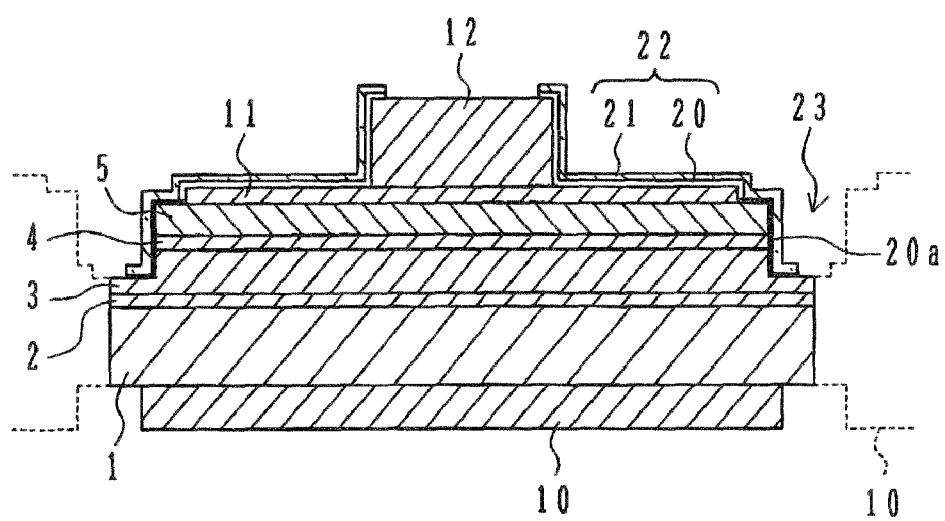

Next, with reference to FIGS. 2A and 2B, description will be made on a ZnO based semiconductor light emitting device according to the first embodiment of the present invention. Prepared is a ZnO based semiconductor wafer formed with the lamination structure described above. A number of light emitting devices are formed on the wafer at the same time, and the wafer is separated into discrete light emitting devices. One light emitting device is illustrated as a representative to describe manufacture processes. FIG. 2A is a schematic plane view, and FIG. 2B is a schematic cross sectional view taken along one-dot chain line AA' in FIG. 2A.

First, a resist mask having a square opening of a p-side electrode 11 shape is formed on a p-type ZnO based semiconductor layer 5, by photolithography. Next, a p-side electrode 11 is formed on the p-type ZnO based semiconductor layer 5 by depositing Ni to a thickness of 0.3 nm to 10 nm and then depositing Au to a thickness of 5 nm to 20 nm by electron beam (EB) deposition. Thereafter, the electrode material other than the material in the mask opening is removed by lift-off.

A structure laminating a plurality of materials (e.g., Ni and Au) in the order starting from the ZnO based semiconductor wafer side is represented by a notation such as Ni/Au, by arranging the material nearer to the ZnO based semiconductor wafer at the leftward position in the notation.

Another method of forming the p-side electrode 11 of the Ni/Au lamination structure may be used as in the following. First, Ni/Au is deposited on the whole surface of the p-type ZnO based semiconductor layer 5 to thicknesses of 0.3 nm to 10 nm/5 nm to 20 nm by EB deposition. Next, a resist mask is formed covering only the p-side electrode 11 by photolithography, the exposed Ni/Au layer in the area other than the area where the p-side electrode is to be formed, is removed by wet etching using aqua regia, and lastly the resist mask is removed. There is no problem even if the underlying p-type ZnO based semiconductor layer 5 is partially etched during etching with aqua regia.

The formed p-side electrode 11 is subjected to heat treatment for 30 seconds at 500° C. in an inert gas added with oxygen, with a rapid thermal annealer (RTA), to thereby conduct alloying, oxydizing and transparizing of the Ni/Au layer. By adding oxygen to the inert gas (nitrogen, argon or the like) during alloying, the Ni/Au layer is oxidized and becomes translucent (Au—Ni—O translucent electrode). Further, tight adhesion between the p-side electrode 11 and p-type ZnO based semiconductor layer 5 is improved.

During alloying, Au moves from the surface of the p-side electrode 11 to the p-type ZnO based semiconductor layer 5 side, and the p-side electrode 11 surface is changed to nickel oxide (lowering an Au surface existence factor). With this phenomenon, tight adhesion between the p-side electrode 11 and a protective layer 22 is improved during a later waterproof protecting film forming process.

Next, a resist mask having an opening of a p-side electrode pad 12 shape is formed on the p-side electrode 11 by photolithography. Ni/Pt/Au is deposited to thicknesses of 1 nm to 10 nm/100 nm/1000 nm by EB deposition to form a p-side electrode pad 12 on the p-side electrode 11. Thereafter, deposited material in an area other than the mask opening is removed by lift-off. The p-side electrode pad 12 may have other structures such as a lamination of Ni/Au at 100 nm/100 nm.

Next, a resist mask having an opening of a contour groove 23 shape is formed on the p-type ZnO based semiconductor layer 5 by photolithography, the resist mask covering the p-side electrode pad 12 and p-side electrode 11. The contour groove 23 defines a border along which each light emitting device is separated.

Next, a contour groove 23 is formed by wet etching. The contour groove is formed by etching the p-type ZnO based semiconductor layer 5 and emission layer 4 and a portion of the n-type ZnO based semiconductor layer 3 in the opening, and has a depth exposing the n-type ZnO based semiconductor layer 3 on the bottom of the groove (a depth extending through the junction between the p-type ZnO based semiconductor layer 5 and n-type ZnO based semiconductor layer 3 (via the emission layer 4)). Etchant may be nitric acid, hydrochloric acid or acetic acid (respectively at a density of above 1 mol/litter to 2 mol/litter). Next, the resist mask is washed and removed.

For the prepared ZnO based semiconductor wafer, a total thickness of the p-type ZnO based semiconductor layer 5 and emission layer 4 was 140 nm and a thickness of the n-type ZnO based semiconductor layer 3 was 350 nm (n-type contact layer of 300 nm and n-type clad layer of 50 nm). Therefore, a depth of the contour groove 23 exposing the n-type ZnO based semiconductor layer 3 at the bottom was set to 240 nm. A depth of the contour groove is properly determined depending upon the lamination structure of a prepared ZnO based semiconductor wafer.

Next, a protective layer 22 is formed. Prior to forming the protective layer 22, a dehydrating process is executed to remove moisture adsorbed to the wafer surface. For example, baking is performed for 10 minutes at 150° C. It is effective to wash the wafer with organic solvent having a high water absorption factor such as acetone and isopropyl alcohol, before baking. Immediately after baking, the wafer is set to a sputtering system so as not to make moisture attach again the wafer surface.

First, a first protective layer 20 is formed by depositing $SiO_2$ to a thickness of 2 nm to 6 nm by sputtering, the first protective layer covering the upper surfaces of the p-side electrode pad 12, p-side electrode 11 and p-type ZnO based semiconductor layer 5 and the inner surface of the contour groove 23. The sputtering conditions for the first protective layer are, for example, an output power of 1500 W, oxygen at 20 sccm, a pressure of 0.4 Pa and a stage temperature of 300° C.

After the first protective layer 20 is formed, the wafer is moved to an RTA system to anneal the wafer, for example, for 60 seconds at 500° C. in an oxygen atmosphere.

Next, the wafer is set again to the sputtering system. A second protective layer 21 is formed by depositing $SiO_2$ to a thickness of about 100 nm by sputtering, the second protective layer covering the first protective layer 20. The sputtering conditions for the second protective layer are, for example, an output power of 800 W, oxygen at 40 sccm, a pressure of 0.8 Pa and a stage temperature of 250° C. The protective layer 22 is therefore a lamination of the first and second protective layers 20 and 21.

The p-side electrode 11 containing nickel oxide and silicon oxide contained in the protective layer 22 have close affinity with each other so that good tight adhesion can be obtained between the p-side electrode 11 and protective layer 22. Tight adhesion is improved by some sintering during annealing after the first protective film 20 is formed.

Sputtering of first layer $SiO_2$ is performed at a higher output power and higher temperature than those of sputtering of second layer $SiO_2$, aiming at forming compound of Zn, Si and O, particularly a Z—Si—O layer 20a containing $Zn_2SiO_4$, during reaction between ZnO and $SiO_2$ in an area exposing ZnO at an underlying layer. $Zn_2SiO_4$ has high insulation and good waterproof.

The Zn—Si—O layer 20a having high waterproof covers an area, particularly a surface exposing the pn junction (in this case, the inner wall of the contour groove 23) so that short circuit of the pn junction (defective diode performance) to be caused by moisture attachment can be suppressed.

The first $SiO_2$ layer is preferably formed in a temperature range not higher than 350° C. The first protective layer 20 is preferably not too thick, and its thickness is preferably set in a range of 2 nm to 20 nm (more preferably in a range of 2 nm to 6 nm). It is known that if the first protective layer 20 is too thick, good waterproof cannot be obtained. Although the reason for this is unknown, it can be considered that there are a possibility that if the layer is too thick, Zn—Si—O composition cannot be obtained, a possibility that strains are formed in a Zn—Si—O film and cracks are formed, and other possibilities.

Annealing after sputtering of first layer $SiO_2$ recovers crystallinity disturbed by the sputtering. If the first protective layer 20 is thin, an annealing time can be shortened advantageously. As the annealing time is shortened, electrode material diffusion due to heat can be suppressed so that an electrode performance can be suppressed from being degraded, and an emission performance is suppressed from being degraded, because impurity diffusion in the operation layer can be suppressed and mutual diffusion of crystal materials can be suppressed. In order to suppress the electrode performance and emission device performance from being degraded, an annealing temperature is preferably set not higher than 500° C. An annealing time is preferably set in a range of 60 seconds to 120 seconds.

Since the first protective layer is very thin, it is likely to be damaged during a later device separation process and a later light emitting diode (LED) lamp forming process. To avoid this, the second $SiO_2$ protective layer is formed on the first protective layer. A thickness of the second protective layer is not limited specifically if the second protective layer can protect the Zn—Si—O layer. However, in order to suppress a stress to be applied to the device and retain a transmission amount of light emitted from the light emitting device, the thickness of about 30 nm to 300 nm is proper. The thickness may be increased when necessary. Sputtering of second layer $SiO_2$ can be performed at a lower output power and lower temperature than those of sputtering of first layer $SiO_2$.

Conditions for forming the first and second protective layers may differ depending upon the performance of a sputtering system to be used. If a stage temperature can be raised to about 500° C. in a load lock chamber, annealing may be performed in the sputtering system in place of the RTA system.

Japanese Patent Publication No. 3453857 discloses a varister device of ZnO, and mitigates a problem that the ZnO varister characteristics are degraded by moisture and solder flow invading in the varister ceramics device, by forming a $Zn_2SiO_4$ layer on the device surface. The $Zn_2SiO_4$ layer is formed by covering the varister device surface of ZnO with $SiO_2$, and by performing a sintering process for 5 minutes to 10 hours at 750° C. to 950° C. in the atmospheric air or oxygen atmosphere (refer to paragraph [0012] of Publication).

In Patent Publication No. 3453857, sintering is performed at a high temperature of 750° C. to 950° C. to conduct reaction between ZnO and $SiO_2$. However, sintering at such a high temperature cannot be used for manufacturing a ZnO based semiconductor device such as a light emitting device.

The present inventors have found a method of forming a Zn—Si—O layer by depositing $SiO_2$ and making $SiO_2$ react with underlying ZnO, without performing such high temperature sintering.

Next, a resist mask is formed having openings corresponding to the upper surface of the p-side electrode pad 12 and the bottom of the contour groove 23, by photolithography. Then, the protective layer 22 exposed in the openings is etched and removed by wet etching to expose the upper surface of the p-side electrode pad 12 and the bottom of the contour groove 23. The resist mask is thereafter washed and removed. By removing the protective layer 22 at the bottom of the contour groove 23, it becomes possible to suppress damages such as striping and cracks of the protective layer 22 to be caused by scribing/breaking at a later device separation process.

Next, the operation layer side of the wafer is adhered to a protective substrate, and the protective substrate is set to a grinder. The substrate 1 having an original thickness of 400 µm is grinded to a thickness of 170 µm. Thereafter, the grinded surface is polished with a polishing machine by gradually lowering a grain number (reducing a grain diameter) of abrasives, until the grinded surface becomes a mirror surface. For example, a final thickness is about 150 µm. As the substrate is thinned, resistance of the substrate 1 lowers.

Next, a resist mask having an opening of an n-side electrode 10 shape is formed on the bottom surface of the substrate 1 of the ZnO based semiconductor wafer by photolithography. Ti/Au is laminated at thicknesses of 10 nm to 100 nm/300 nm to 1000 nm by EB deposition to form an n-side electrode 10 on the bottom surface of the substrate 1. Thereafter, deposited material in an area other than the mask opening is removed by lift-off.

The structure of the n-side electrode 10 may be Mo/Al, Mo/Ag, Cr/Al or Cr/Ag in addition to Ti/Au. Instead of Al and Ag of the second layer, Rh, Pt or the like may be used.

Next, scribe grooves are formed in areas where the bottom surface of the substrate 1 is exposed (areas sandwiched between n-side electrodes 10 of adjacent devices). After the scribe grooves are formed, a knife edge of a breaking machine is pushed against the area where the n-type ZnO based semiconductor layer 3 is exposed at the bottom of the contour groove 23 to separate the wafer into light emitting devices.

Each separated independent light emitting device is adhered to a frame, a stem, a wiring substrate, a heat sink and the like, by bonding with silver paste, resin or the like, soldering, ultrasonic bonding with bumps, thermocompression bonding with eutectic bonding material, or the like. Thereafter, electrode pad and lead electrode are connected by gold wires or the like. Resin which contains dispersed phosphor is filled, and lastly resin sealing or can packaging is performed to form an LED lamp.

Figure 3:
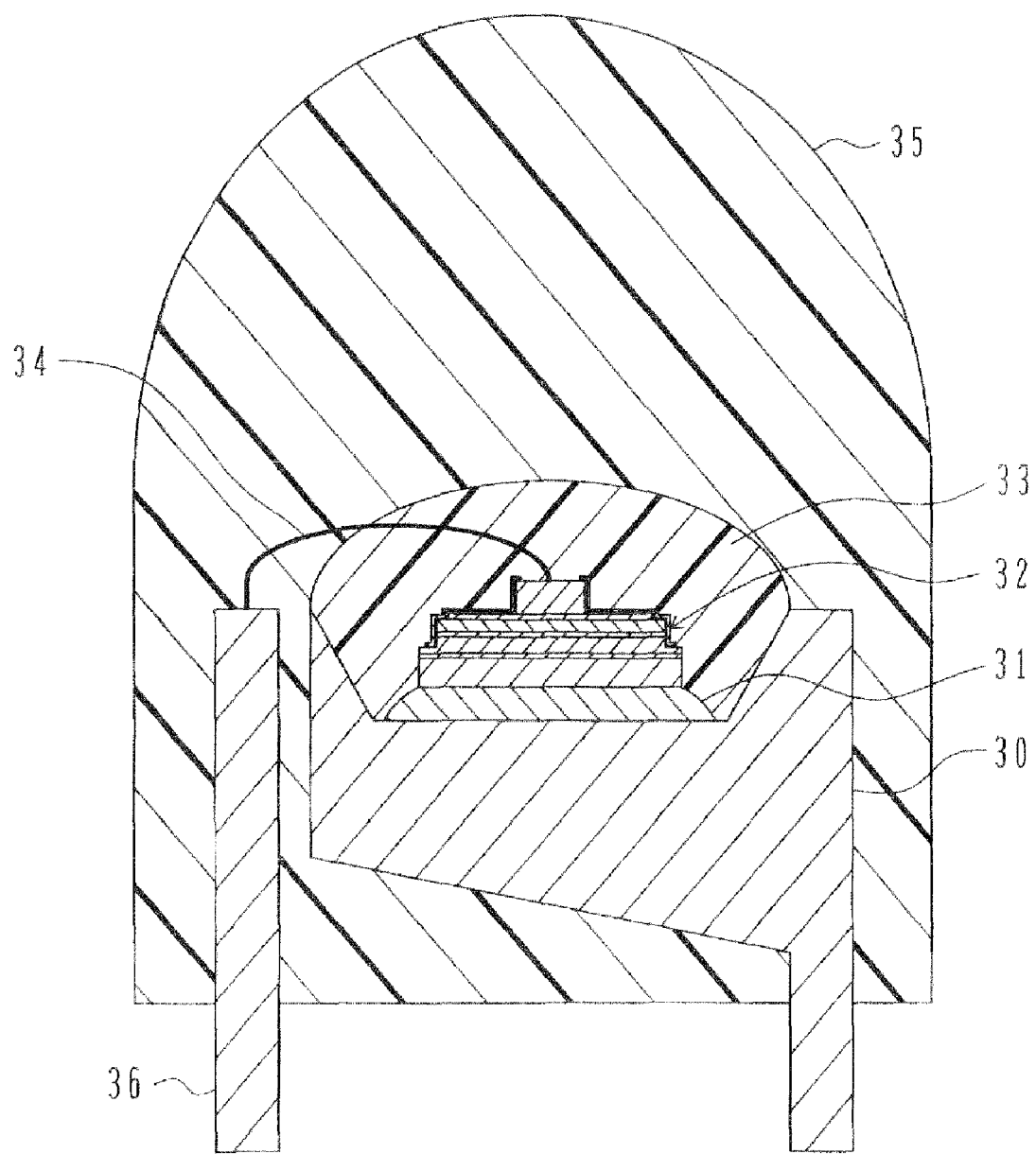
FIG. 3 is a schematic cross sectional view illustrating an example of the structure of an LED lamp.

FIG. 3 is a schematic cross sectional view illustrating an example of the structure of an LED lamp. A light emitting device 32 is die-bonded by bonding an n-side electrode on a horn (having a slanted side wall for upward reflecting light sidewise emitted from the device) of a frame 30, for example, with silver paste 31. A p-side electrode pad is wire-bonded to a pin 36 with a gold wire 34. Resin 33 containing dispersed phosphor is potted covering the light emitting device 32, and lastly a resin mold 35 is formed.

Next, description will be made on ZnO based semiconductor light emitting devices of first to third comparative examples. The first to third comparative examples use a protective layer forming process different from that of the first embodiment. Other structures are similar to those of the first embodiment.

Figure 4A:
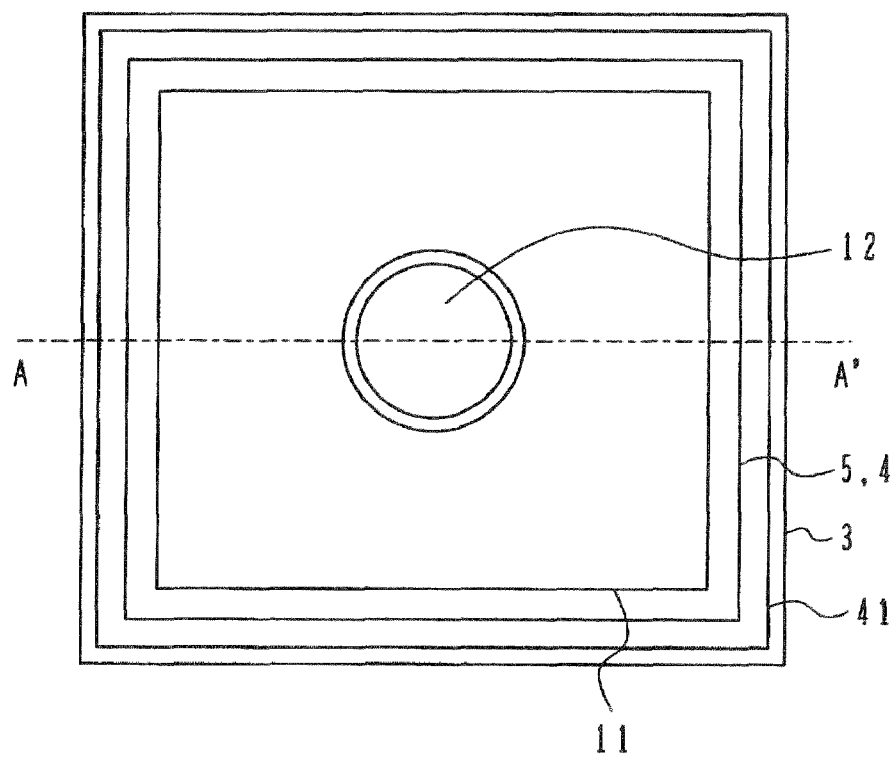
FIGS. 4A and 4B are a schematic plan view and a schematic cross sectional view, respectively, of a light emitting device according to a first comparative example.
Figure 4B:
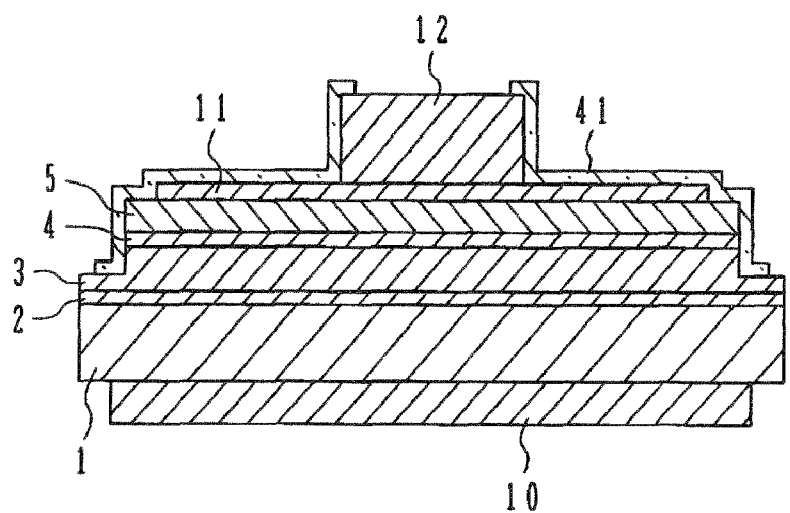

First, with reference to FIGS. 4A and 4B, the first comparative example will be described. In the first comparative example, the first $SiO_2$ layer forming process and following anneal process of the first embodiment are omitted, and only a single $SiO_2$ layer is formed as a protective layer 41 under the second layer forming conditions.

Next, the second and third comparative examples will be described. In the second comparative example, the protective layer is made of two layers formed by depositing not $SiO_2$ but $Al_2O_3$ under the same conditions as those of the first embodiment. In the third comparative example, the protective layer is made of only a single layer formed by depositing not $SiO_2$ but $Al_2O_3$ under the same conditions as those of the first embodiment. Namely, in the second comparative example, a first $Al_2O_3$ layer is formed by sputtering under the conditions of an output power of 1500 W, oxygen at 20 sccm, a pressure of 0.4 Pa and a stage temperature of 300° C. Next, annealing is performed for 60 seconds to 120 seconds at 500° C. in an oxygen atmosphere. A second $Al_2O_3$ layer is formed by sputtering under the conditions of an output power of 800 W, oxygen at 40 sccm, a pressure of 0.8 Pa and a stage temperature of 250° C. In the third comparative example, only a single $Al_2O_3$ layer is formed under the same conditions as those for the second layer of the second comparative example. $Al_2O_3$ is material generally used for a protective layer of LED using AlGaAs, InGaAlP, InGaN or the like, similar to $SiO_2$.

Next, description will be made on experiments which evaluated waterproof of ZnO based semiconductor light emitting devices of the first embodiment and the first to third comparative examples by moisture-proof tests.

Figure 5:
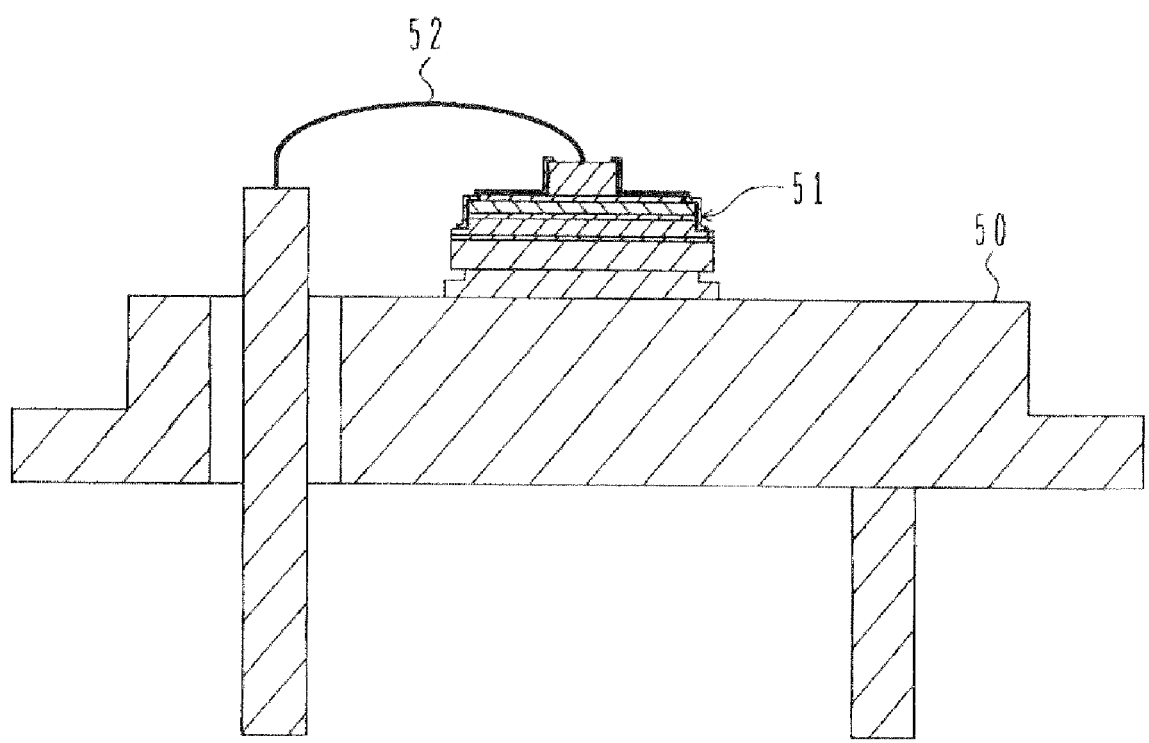
FIG. 5 is a schematic cross sectional view illustrating the structure of a sample used for a moisture-proof test.
Figure 6A:
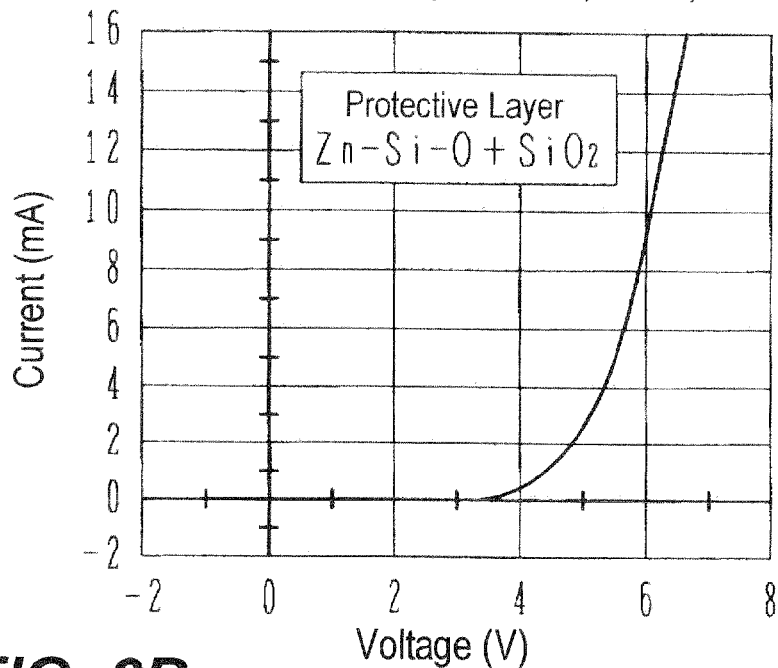
FIGS. 6A and 6B are graphs illustrating the voltage-current characteristics of the light emitting device of the first embodiment before and after exposure.
Figure 6B:
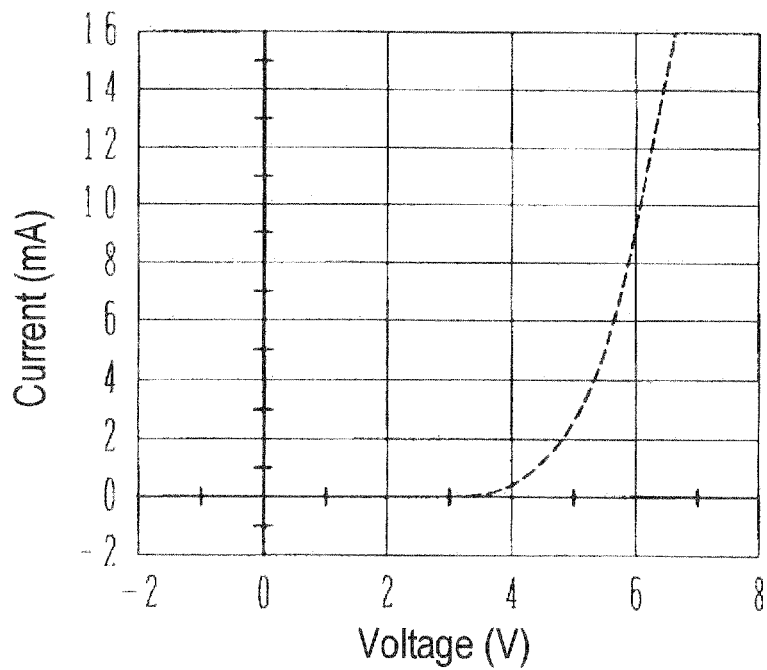
Figure 7A:
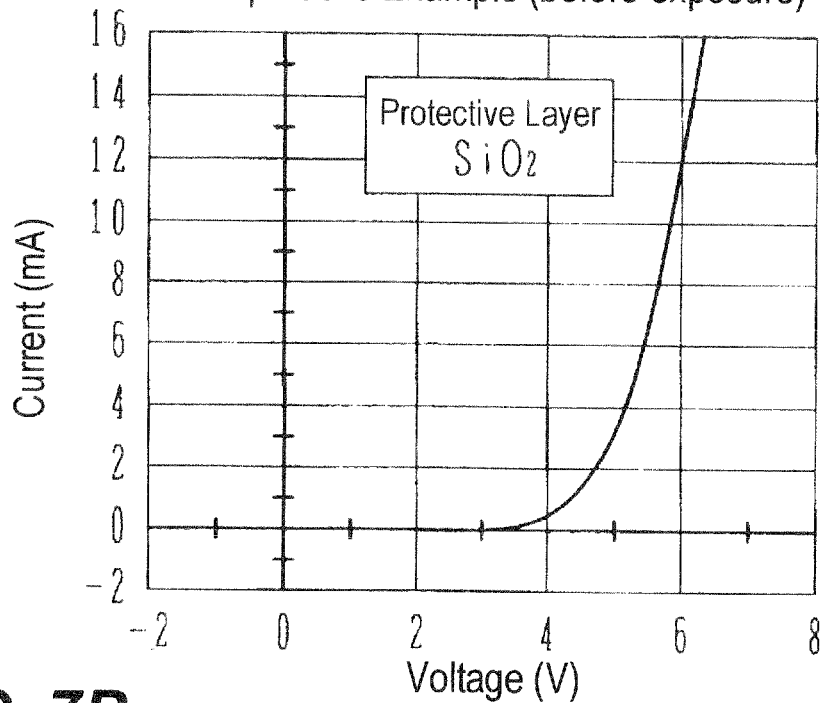
FIGS. 7A and 7B are graphs illustrating the voltage-current characteristics of the light emitting device of the first comparative example before and after exposure.
Figure 7B:
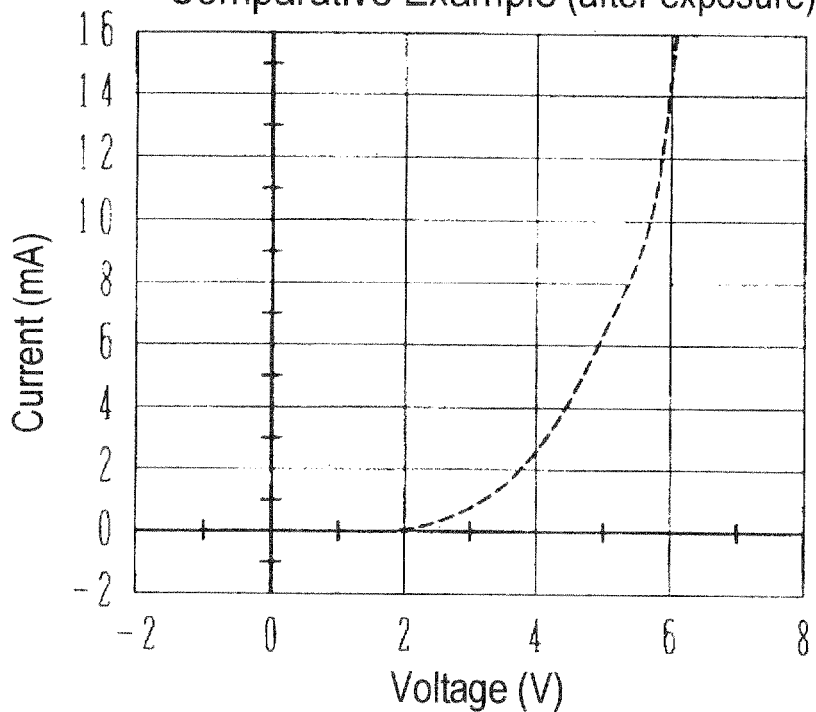
Figure 8A:
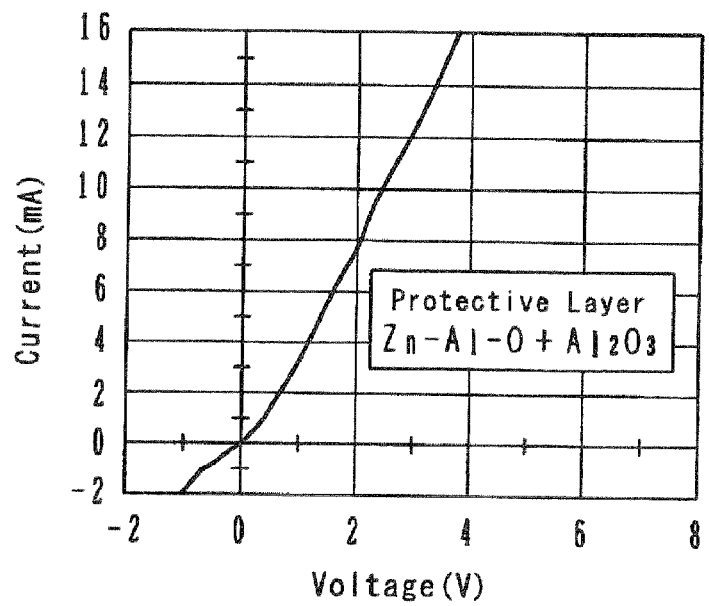
FIGS. 8A and 8B are graphs illustrating the voltage-current characteristics of a light emitting device of a second comparative example before and after exposure.
Figure 8B:
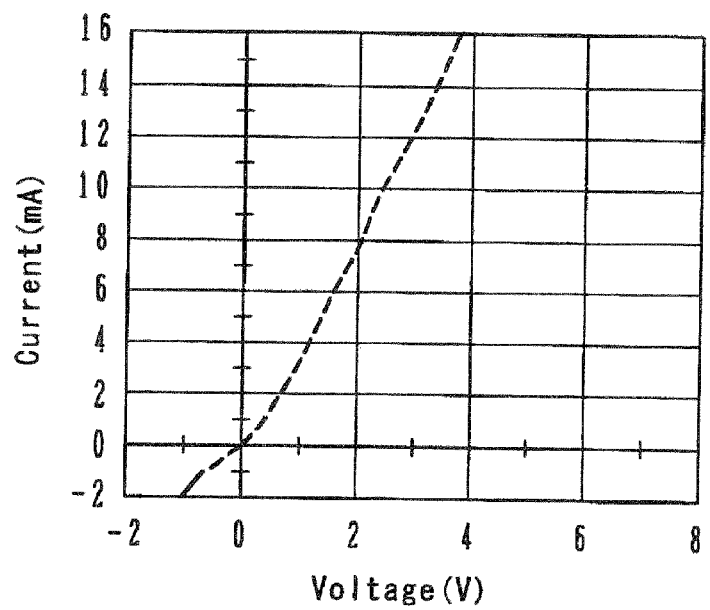
Figure 9A:
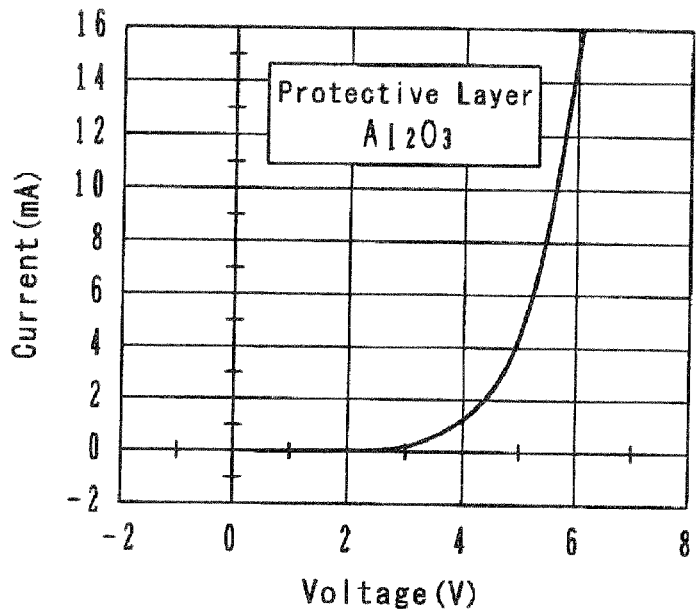
FIGS. 9A and 9B are graphs illustrating the voltage-current characteristics of a light emitting device of a third comparative example before and after exposure.
Figure 9B:
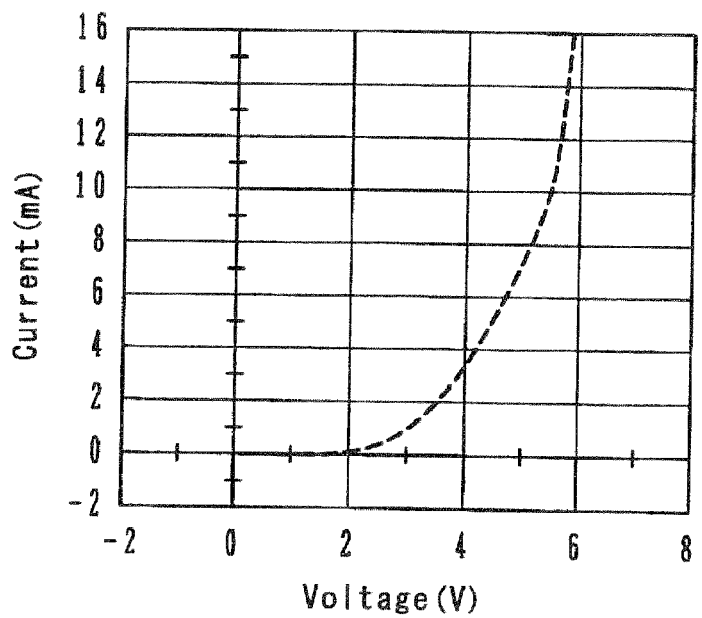

FIG. 5 is a schematic cross sectional view illustrating the structure of a sample used for moisture-proof tests. An arrangement was adopted for a light emitting device 51 of each of the first embodiment and the first to third comparative examples, in which arrangement an n-side electrode is bonded to a can package 50 (TO-46) with Ag paste and a p-side electrode is bonded by a gold wire 52.

Moisture-proof tests were conducted by a procedure of first measuring current-voltage characteristics of these four samples, then exposing the samples in a high temperature (60° C.) and high humidity (80%) environment for 480 hours, and again measuring the current-voltage characteristics of the four samples.

FIGS. 6A, 7A, 8A and 9A are graphs illustrating the voltage-current characteristics of the first embodiment and the first to third comparative examples before exposure, respectively, and FIGS. 6B, 7B, 8B and 9B are graphs illustrating the voltage-current characteristics of the first embodiment and the first to third comparative examples after exposure, respectively.

In both the first embodiment and first comparative example using $SiO_2$ as a protective layer, the current-voltage characteristics before exposure indicated good diode characteristics. Optical emission from the devices were recognized. The current-voltage characteristics after exposure indicated good diode characteristics and optical emission was maintained for the first embodiment, whereas the diode characteristics was degraded and optical emission became weak for the first comparative example.

In the second and third comparative examples using $Al_2O_3$ as a protective layer, diode characteristics was lost for the second comparative example even at the stage before exposure. The third comparative example indicated normal diode characteristics, and optical emission was recognized, before exposure. After exposure, the second comparative example remained loosing the diode characteristics, and the third comparative example indicated degraded diode characteristics and optical emission became weak.

As above, only the light emitting device of the first embodiment provided good diode characteristics and optical emission before and after exposure to the high temperature and high humidity environment. It can be considered that the Zn—Si—O layer of the first protective layer of the first embodiment functions as a good waterproof protective layer.

The first comparative example, forming only the $SiO_2$ layer not containing a Zn—Si—O layer as the protective layer, was unable to obtain sufficient waterproof. Although this reason is unknown, it is presumed, for example, that ZnO based semiconductor crystal is more hydrophilic than the protective layer and moisture permeates through the protective layer in an amorphous or polycrystalline state. This presumption may be applicable to the third comparative example using a single $Al_2O_3$ as the protective layer.

$Al_2O_3$ is an excellent insulating material as a simple substance, and is widely used as insulating material or insulators in electronic components and power feeding wires. It is used in some cases as an insulating film of a semiconductor light emitting device. As $Al_2O_3$ reacts with ZnO, AZO is formed which is an excellent transparent conductive film.

It can be considered that the third comparative example forms only the $Al_2O_3$ layer on the ZnO based semiconductor light emitting device. However, it can be considered that the second comparative example forms the $Al_2O_3$ layer at a higher output and a higher temperature than the third comparative example so that AZO is formed and a short circuit occurs, resulting in lost diode characteristics.

Figure 10A:
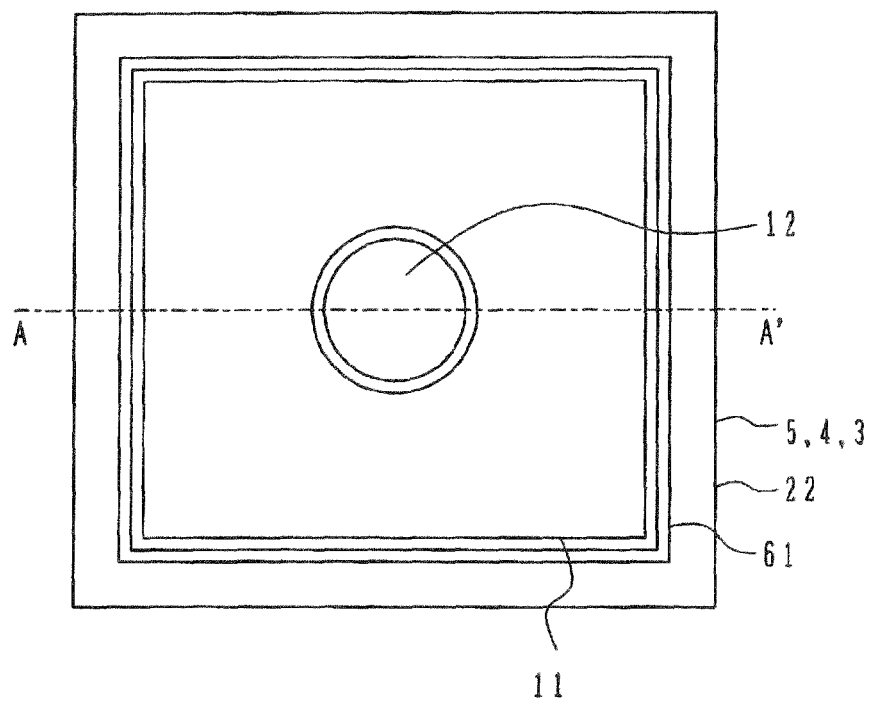
FIGS. 10A to 10C are a schematic plan view and a schematic cross section view of a light emitting device of a second embodiment and an enlarged cross sectional view illustrating a region near a pn junction separation groove, respectively.
Figure 10B:
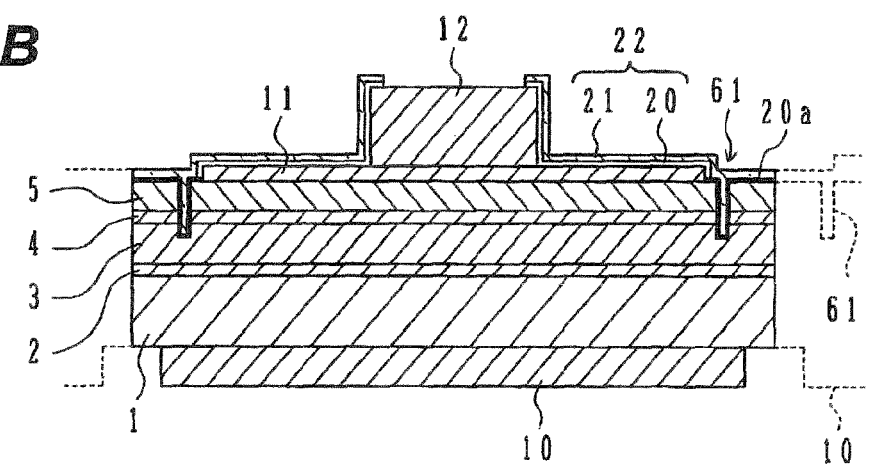

Next, description will be made on a ZnO based semiconductor light emitting device of the second embodiment, with reference to FIGS. 10A to 10C. The layers up to the p-side electrode pad 12 are formed by similar processes to those of the first embodiment. Next, a resist mask having an opening of a pn junction separation groove 61 shape is formed on the p-type ZnO based semiconductor layer 5 by photolithography. The resist mask covers the p-side electrode pad 12 and p-side electrode 11. The pn junction separation groove 61 surrounds the p-side electrode 11 as viewed in plan, and is disposed at a position spaced inner than the side edge of each light emitting device.

Next, a pn junction separation groove 61 is formed by wet etching the p-type ZnO based semiconductor layer 5 and emission layer 4 and a portion of the n-type ZnO based semiconductor layer 3 in the opening, and has a depth exposing the n-type ZnO based semiconductor layer 3 on the bottom of the groove (a depth extending through the pn junction). Next, the resist mask is washed and removed.

A width of the pn junction separation groove 61 is, for example, 1 μm. Although the groove width may be made wider, the width is preferably about 3 μm in order to prevent a device die size from becoming large and suppress a manufacture yield from lowering.

For example, a total thickness of the p-type ZnO based semiconductor layer 5 and emission layer 4 is 140 nm, a thickness of the n-type ZnO based semiconductor layer 3 is 350 nm (n-type contact layer of 300 nm and n-type clad layer of 50 nm) and a depth of the pn junction separation groove 61 exposing the n-type ZnO based semiconductor layer 3 at the bottom is set to 240 nm. A depth of the pn junction separation groove is properly determined depending upon the lamination structure of a prepared ZnO based semiconductor wafer.

Thereafter, the layers from the protective layer 22 to the n-side electrode 10 are formed by similar processes to those of the first embodiment. Although the protective layer 22 at the bottom of the contour groove 23 is removed in the first embodiment, the protective layer 22 at the bottom of the pn junction separation groove 61 is not removed in the second embodiment.

Figure 10C:
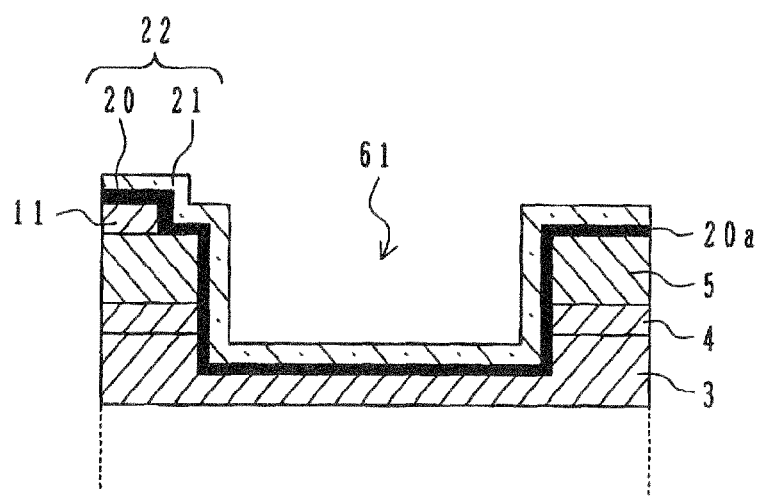

FIG. 10C is an enlarged cross sectional view illustrating the region near the pn junction separation groove 61. The protective layer 22 covers the whole inner surface of the pn junction separation groove 61. A region of the first $SiO_2$ layer 20 contacting underlying ZnO is changed to the Zn—Si—O layer 20a. The side wall of the pn junction separation groove 61 exposing the pn junction is protected by the Zn—Si—O layer 20a to suppress a short circuit of the pn junction.

Next, similar to the first embodiment, scribe grooves are formed in areas exposing the bottom surface of the substrate 1 (areas sandwiched between n-side electrodes 10 of adjacent devices). After the scribe grooves are formed, a knife edge of a breaking machine is pushed against the protective layer 22 at the position vertically above the scribe groove to separate the wafer into individual light emitting devices. A process of forming an LED lamp by using an individually separated light emitting device is similar to that of the first embodiment.

In the second embodiment, even if stripping, cracks or the like of the protective layer 22 occurs during breaking, these damages are stopped outside the pn junction separation groove 61. It is therefore possible to suppress damages of the protective layer 22 particularly on the inner surface of the pn junction separation groove 61.

In the second embodiment, the pn junction separation groove 61 is formed being spaced inner than the side edge of the device and surrounding the p-side electrode 11. Current during emission will not flow outside the pn junction separation groove 61. Therefore, even if moisture or the like attaches the area near the junction exposed at the device side edge, the characteristics are suppressed from being degraded.

Figure 11A:
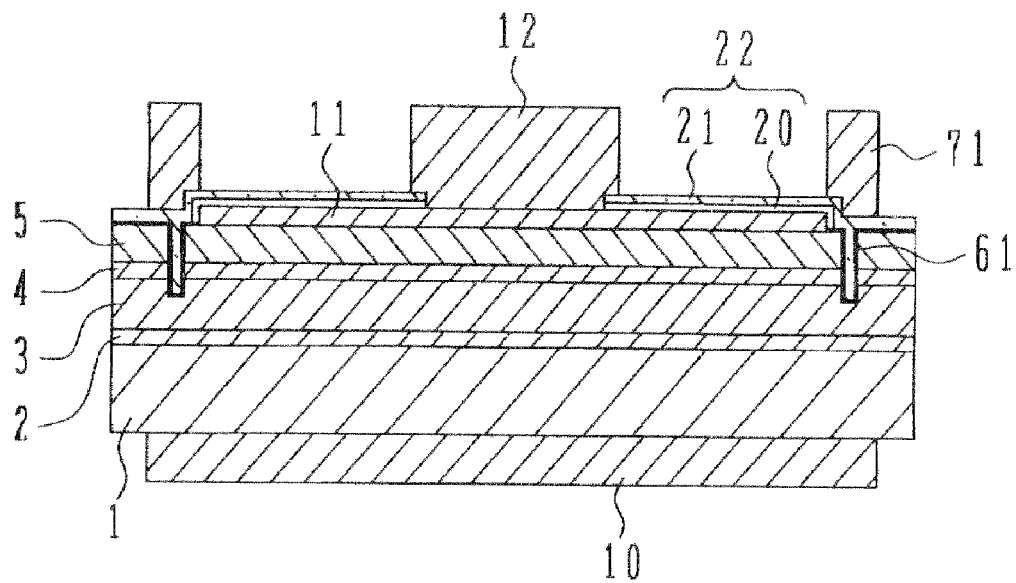
FIGS. 11A and 11B are a schematic cross section view of a light emitting device of a third embodiment and an enlarged cross sectional view illustrating a region near a pn junction separation groove, respectively.
Figure 11B:
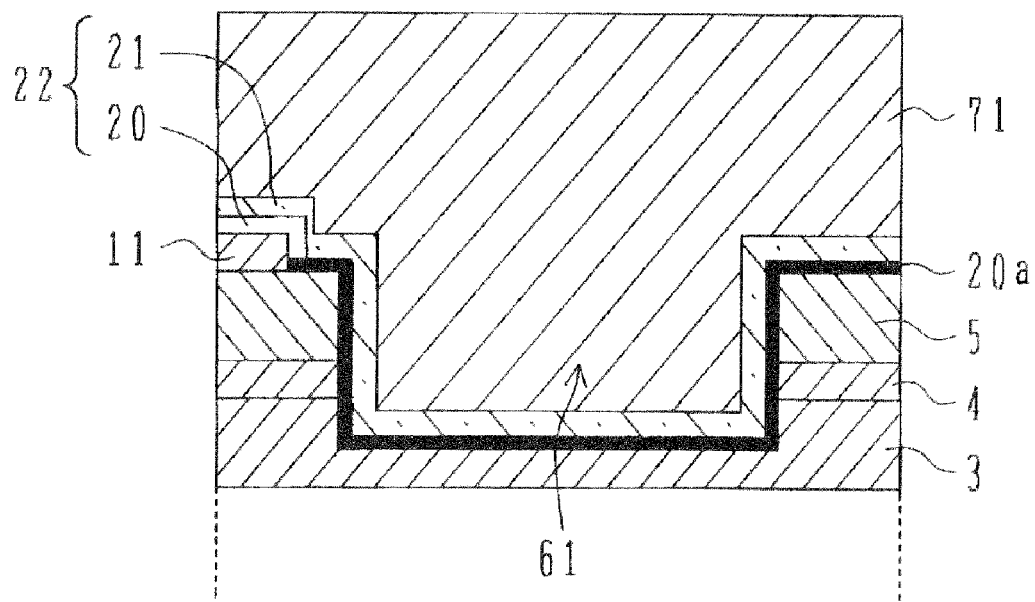

Next, description will be made on a ZnO based semiconductor light emitting device of the third embodiment, with reference to FIGS. 11A and 11B. By using similar processes to those of the second embodiment, the layers up to a p-side electrode 11 are formed, next a pn junction separation groove 61 is formed, and a protective layer 22 is formed. The protective layer 22 is formed on the p-type ZnO based semiconductor layer 5, covering the p-side electrode 11 and the inner surface of the pn junction separation groove 61.

Next, a resist mask having an opening of a p-side electrode pad 12 shape is formed on the protective layer 22 by photolithography. The protective layer 22 in the opening is removed by wet etching to expose the p-side electrode 11.

Next, a resist mask having openings of a p-side electrode pad 12 shape and a buried protective member 71 shape is formed on the protective layer 11 by photolithography. As shown in FIG. 11B, a buried protective member 71 is disposed burying the pn junction separation groove 61 and covering the protective layer 22.

Ni/Au is laminated at thicknesses of 100 nm/1000 nm by EB deposition to form a p-side electrode pad 12 and the buried protective member 71. Thereafter, the deposited material in an area other than the mask openings is removed by lift-off. Thereafter, an n-side electrode 10 is formed, the wafer is separated into individual light emitting devices, and an LED lamp is formed.

In the third embodiment, the buried protective member 71 is formed being stacked upon the waterproof protective layer 22. Therefore, a thickness of a protective layer for protecting the inner surface of the pn junction separation groove 61 is made considerably thick so that moisture-proof is improved. The buried protective member 71 can be formed by the same process for the p-side electrode pad 12.

Although the ZnO based semiconductor light emitting device has been described in the above embodiments, the embodiment technologies are not limited to be applied only to the light emitting device, but the embodiment technologies may be applied also to other ZnO based semiconductor devices, with expected advantages of suppressing a short circuit of a pn junction and the like.

Although a manufacture for LED has been described by way of example in the above embodiments, for example, a laser diode (LD) can be formed by forming a cavity through cleavage.

The present invention has been described above in connection with the embodiments. The present invention is not limited only to the embodiment. For example, it is apparent for What are claimed are:

1. A ZnO based semiconductor device comprising:
a lamination structure including a first semiconductor layer containing ZnO based semiconductor of a first conductivity type and a second semiconductor layer containing ZnO based semiconductor of a second conductivity type opposite to said first conductivity type, said second semiconductor layer being formed above said first semiconductor layer and forming a pn junction together with said first semiconductor layer;
a Zn—Si—O layer containing a compound of Zn, Si and O and covering a surface exposing said pn junction of said lamination structure; and
an $SiO_2$ layer formed on said Zn—Si—O layer.

2. The ZnO based semiconductor device according to claim 1, wherein a thickness of said Zn—Si—O layer is in a range of 2 nm to 20 nm.

3. The ZnO based semiconductor device according to claim 1, wherein a thickness of said $SiO_2$ layer is in a range of 30 nm to 300 nm.

4. The ZnO based semiconductor device according to claim 1, wherein a groove is provided from a surface of said lamination structure to a depth such that said groove extends through said pn junction, and
wherein said Zn—Si—O layer covers an inner surface of said groove.

5. The ZnO based semiconductor device according to claim 4, further comprising a protective member which buries said groove and is formed above said Zn—Si—O layer.

6. A method for making the ZnO based semiconductor device of claim 1, the method comprising:
(a) forming said lamination structure by preparing a ZnO based semiconductor wafer including the first semiconductor layer containing the ZnO based semiconductor of the first conductivity type and the second semiconductor layer containing the ZnO based semiconductor of the second conductivity type opposite to said first conductivity type, the second semiconductor layer being formed above said first semiconductor layer and forming the pn junction together with said first semiconductor layer;
(b) forming a groove in said ZnO based semiconductor wafer, said groove having a depth extending through said pn junction; and
(c) forming said Zn—Si—O layer containing the compound of Zn, Si and O and covering said pn junction exposed on an inner surface of said groove.

7. The method according to claim 6, wherein said step (c) deposits $SiO_2$ on the inner surface of said groove to make underlying ZnO based semiconductor react with $SiO_2$ and form said Zn—Si—O layer.

8. The method according to claim 7, wherein after $SiO_2$ is deposited at said step (c), annealing is performed.

9. The method according to claim 6, further comprising:
(d) forming the $SiO_2$ layer on said Zn—Si—O layer.

10. A ZnO based semiconductor device comprising:
a lamination structure including a first semiconductor layer containing ZnO based semiconductor of a first conductivity type and a second semiconductor layer containing ZnO based semiconductor of a second conductivity type opposite to said first conductivity type, said second semiconductor layer being formed above said first semiconductor layer;
a Zn—Si—O layer containing a compound of Zn, Si and O and continuously covering an area between at least a portion of a side wall of said first semiconductor layer of said lamination structure and at least a portion of a side wall of said second semiconductor layer; and
an $SiO_2$ layer formed on said Zn—Si—O layer.

* * * * *